(12) United States Patent
Sugiyama et al.

(10) Patent No.: US 11,874,165 B2
(45) Date of Patent: Jan. 16, 2024

(54) DETECTION DEVICE (71) Applicant: Japan Display Inc., Tokyo (JP)

(72) Inventors: Hiroki Sugiyama, Tokyo (JP);
Takahiro Shoji, Tokyo (JP); Kaoru Taketa, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 18/195,634

(22) Filed: May 10, 2023

(65) Prior Publication Data
US 2023/0366733 A1 Nov. 16, 2023

(30) Foreign Application Priority Data
May 16, 2022 (JP) .................................. 2022-079927

(51) Int. Cl.
*G01J 1/44* (2006.01)
(52) U.S. Cl.
CPC ............ *G01J 1/44* (2013.01); *G01J 2001/446* (2013.01)
(58) Field of Classification Search
CPC ............................. G01J 1/44; G01J 2001/446
See application file for complete search history.

(56) References Cited

U.S. PATENT DOCUMENTS

| | | | | |
|---|---|---|---|---|
| 9,985,061 | B2 * | 5/2018 | Miyamoto | ........ H01L 27/14609 |
| 10,355,040 | B2 * | 7/2019 | Ito | ..................... H01L 27/14612 |
| 2009/0026509 | A1 | 1/2009 | Hayashi et al. | |
| 2009/0218646 | A1 | 9/2009 | Okada | |
| 2012/0038018 | A1 | 2/2012 | Yamada et al. | |
| 2013/0149809 | A1 | 6/2013 | Yamada et al. | |
| 2015/0021613 | A1 | 1/2015 | Hayashi et al. | |

FOREIGN PATENT DOCUMENTS

| | | |
|---|---|---|
| JP | 2008-283113 A | 11/2008 |
| JP | 2012-039004 A | 2/2012 |
| JP | 2013-140987 A | 7/2013 |

* cited by examiner

*Primary Examiner* — Seung C Sohn
(74) *Attorney, Agent, or Firm* — K&L Gates LLP (57) ABSTRACT According to an aspect, a detection device includes: a substrate; a photodiode in which a lower electrode, a semiconductor layer, and an upper electrode are stacked on the substrate in the order as listed; a transistor provided in the photodiode; and an insulating layer provided between layers of the transistor and the photodiode. The insulating layer has a contact hole provided in a central portion of the photodiode in plan view. The lower electrode of the photodiode is provided on the insulating layer, is provided continuously in an area overlapping the contact hole, and is electrically coupled to the transistor at a bottom of the contact hole. A first opening is provided in an area of the upper electrode that overlaps the contact hole.

9 Claims, 11 Drawing Sheets

DETECTION DEVICE

CROSS-REFERENCE TO RELATED APPLICATION

This application claims the benefit of priority from Japanese Patent Application No. 2022-079927 filed on May 16, 2022, the entire contents of which are incorporated herein by reference.

BACKGROUND

1. Technical Field

What is disclosed herein relates to a detection device.

2. Description of the Related Art

Each of Japanese Patent Application Laid-open Publication No. 2008-283113 (JP-A-2008-283113), Japanese Patent Application Laid-open Publication No. 2012-039004 (JP-A-2012-039004), and Japanese Patent Application Laid-open Publication No. 2013-140987 (JP-A-2013-140987) describes a detection device (described as a photosensor, a photoelectric conversion element, and an electromagnetic wave detection element in JP-A-2008-283113, JP-A-2012-039004, and JP-A-2013-140987, respectively) in which a plurality of positive-intrinsic-negative (PIN) photodiodes are arranged on a substrate. The PIN photodiodes are mounted on what is called an active matrix array substrate on which a plurality of transistors are arranged in a matrix having a row-column configuration.

Such a detection device is provided with contact holes for electrically coupling the transistors to the photodiodes. In JP-A-2008-283113 and JP-A-2013-140987, the photodiodes are provided in areas that do not overlap steps formed by the contact holes. In JP-A-2012-039004, p-type semiconductor layers of the photodiodes are provided in the areas that do not overlap the steps formed by the contact holes.

The steps formed by the contact holes or the like may cause leak paths between lower electrodes and upper electrodes of the photodiodes. In JP-A-2008-283113, JP-A-2012-039004, and JP-A-2013-140987, the arrangement of the photodiodes is restricted by the positional relation between the transistors and the contact holes. This restriction may reduce the effective light-receiving area of the photodiodes, resulting in a reduction in detection sensitivity.

SUMMARY

According to an aspect, a detection device includes: a substrate; a photodiode in which a lower electrode, a semiconductor layer, and an upper electrode are stacked on the substrate in the order as listed; a transistor provided in the photodiode; and an insulating layer provided between layers of the transistor and the photodiode. The insulating layer has a contact hole provided in a central portion of the photodiode in plan view. The lower electrode of the photodiode is provided on the insulating layer, is provided continuously in an area overlapping the contact hole, and is electrically coupled to the transistor at a bottom of the contact hole. A first opening is provided in an area of the upper electrode that overlaps the contact hole.

According to an aspect, a detection device includes: a substrate; a photodiode in which a lower electrode, a semiconductor layer, and an upper electrode are stacked on the substrate in the order as listed; a transistor provided in the photodiode; and an insulating layer provided between layers of the transistor and the photodiode. The insulating layer has a contact hole provided at a corner of the photodiode in plan view. The lower electrode and the semiconductor layer of the photodiode are provided on the insulating layer and are provided continuously in an area overlapping the contact hole. The lower electrode is electrically coupled to the transistor at a bottom of the contact hole. A cutout is provided in an area of the upper electrode that overlaps the contact hole on the upper side of the semiconductor layer.

DETAILED DESCRIPTION

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

Figure 1:
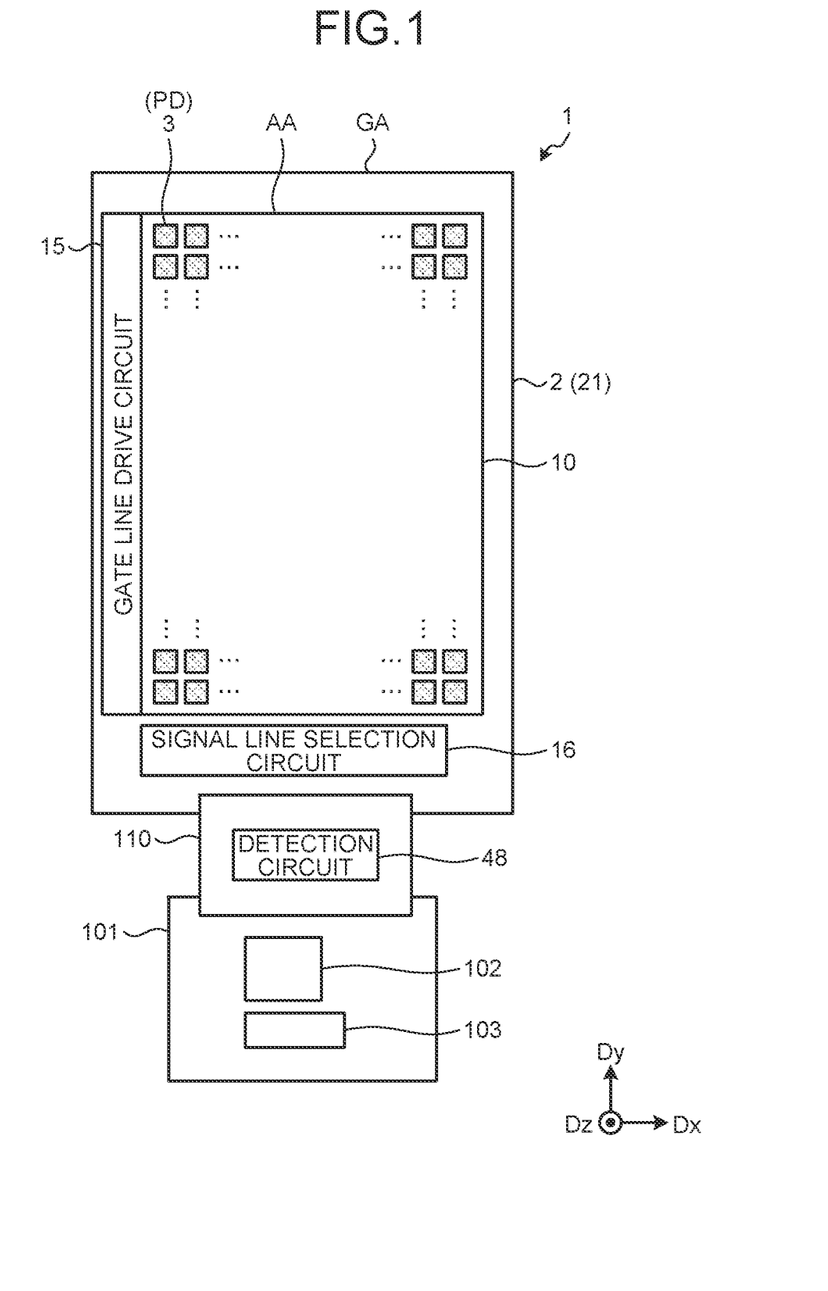
FIG. 1 is a plan view illustrating a detection device according to a first embodiment.

FIG. 1 is a plan view illustrating a detection device according to a first embodiment. As illustrated in FIG. 1, a detection device 1 includes an array substrate 2 (substrate 21), a sensor 10, a gate line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor 10, the gate line drive circuit 15, and the signal line selection circuit 16 to control a detection operation of the sensor 10. The power supply circuit 103 supplies voltage signals including, for example, a power supply potential SVS (refer to FIG. 3) to the sensor 10 and the gate line drive circuit 15.

The substrate 21 has a detection area AA and a peripheral area GA. The detection area AA is an area provided with a plurality of photodiodes PD. The peripheral area GA is an area between the outer perimeter of the detection area AA and the edges of the substrate 21 and is an area not provided with the photodiodes PD. The gate line drive circuit 15 and the signal line selection circuit 16 are provided in the peripheral area GA of the substrate 21.

In the following description, a first direction Dx is one direction in a plane parallel to the substrate 21. A second direction Dy is one direction in the plane parallel to the substrate 21 and is a direction orthogonal to the first direction Dx. The second direction Dy may non-orthogonally intersect the first direction Dx. A third direction Dz is a direction orthogonal to the first direction Dx and the second direction Dy. The third direction Dz is a direction normal to the substrate 21. The term "plan view" refers to a positional relation when viewed from a direction orthogonal to the substrate 21.

A plurality of detection elements 3 (photodiodes PD) are arranged in a matrix having a row-column configuration in the detection area AA. In other words, the detection elements 3 (photodiodes PD) are arranged in the first direction Dx and the second direction Dy in the detection area AA. Herein, each of the detection elements 3 of the sensor 10 is an optical sensor that includes a corresponding one of the photodiodes PD, a capacitive element Ca, and a transistor Tr (refer to FIG. 3) as sensor elements. Each of the photodiodes PD outputs an electrical signal corresponding to light emitted thereto. More specifically, the photodiode PD is a positive-intrinsic-negative (PIN) photodiode. Each of the photodiodes PD included in the detection elements 3 performs detection in accordance with a gate drive signal VGL supplied from the gate line drive circuit 15. Each of the photodiodes PD outputs the electrical signal corresponding to the light emitted thereto as a detection signal Vdet to the signal line selection circuit 16. The detection device 1 detects information on a living body based on the detection signals Vdet received from the photodiodes PD.

Figure 2:
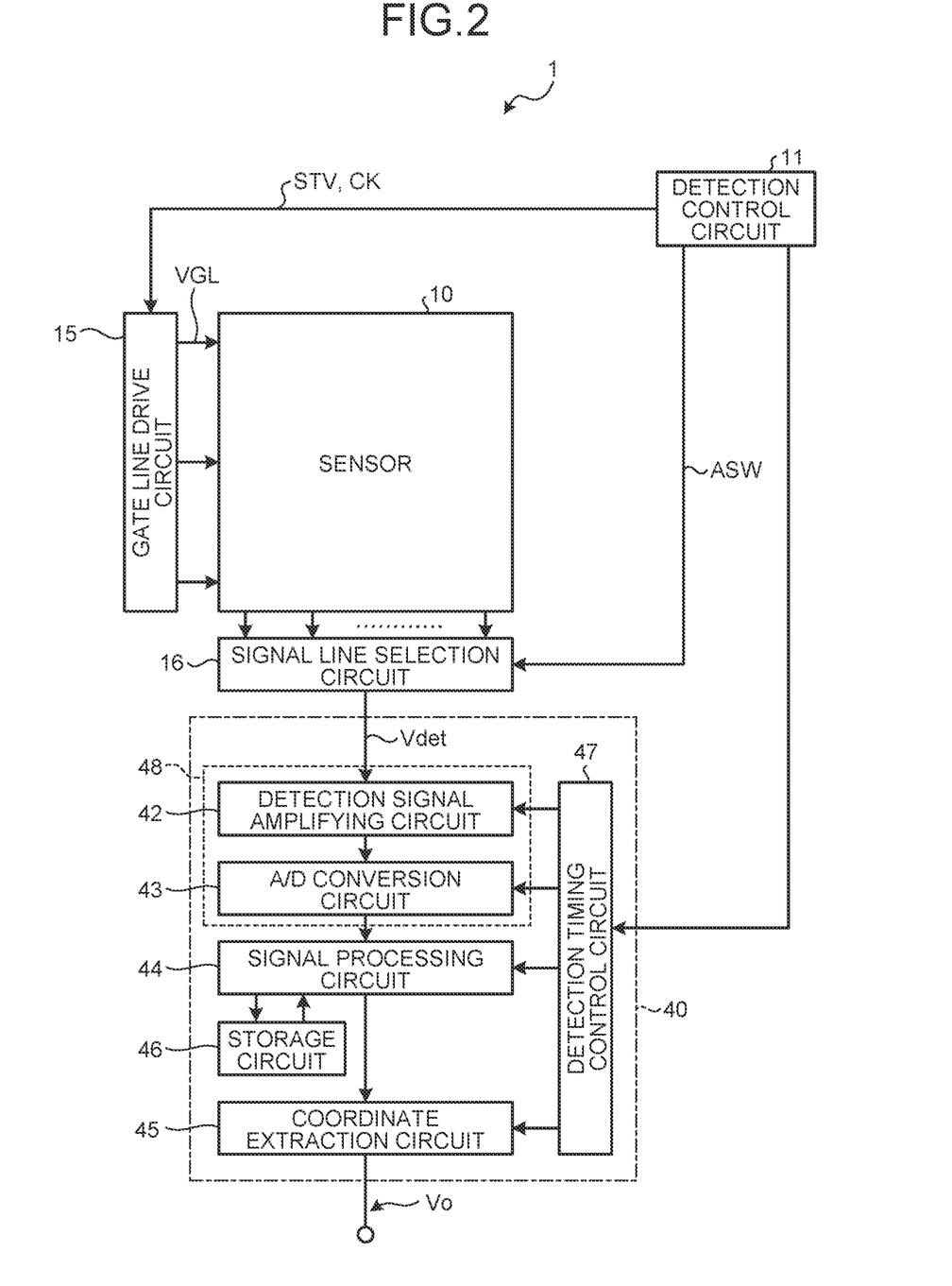
FIG. 2 is a block diagram illustrating a configuration example of the detection device according to the first embodiment.

FIG. 2 is a block diagram illustrating a configuration example of the detection device according to the first embodiment. As illustrated in FIG. 2, the detection device 1 further includes a detection control circuit 11 and a detector 40. The control circuit 102 includes one, some, or all functions of the detection control circuit 11. The control circuit 102 also includes one, some, or all functions of the detector 40 other than those of the detection circuit 48.

The detection control circuit 11 is a circuit that supplies respective control signals to the gate line drive circuit 15, the signal line selection circuit 16, and the detector 40 to control operations thereof. The detection control circuit 11 supplies various control signals including, for example, a start signal STV and a clock signal CK to the gate line drive circuit 15. The detection control circuit 11 also supplies various control signals including, for example, a selection signal ASW to the signal line selection circuit 16.

The gate line drive circuit 15 is a circuit that drives a plurality of gate lines GL (refer to FIG. 4) based on the various control signals. The gate line drive circuit 15 sequentially or simultaneously selects the gate lines GL, and supplies the gate drive signals VGL to the selected gate lines GL. Through this operation, the gate line drive circuit 15 selects the photodiodes PD coupled to the gate lines GL.

Figure 4:
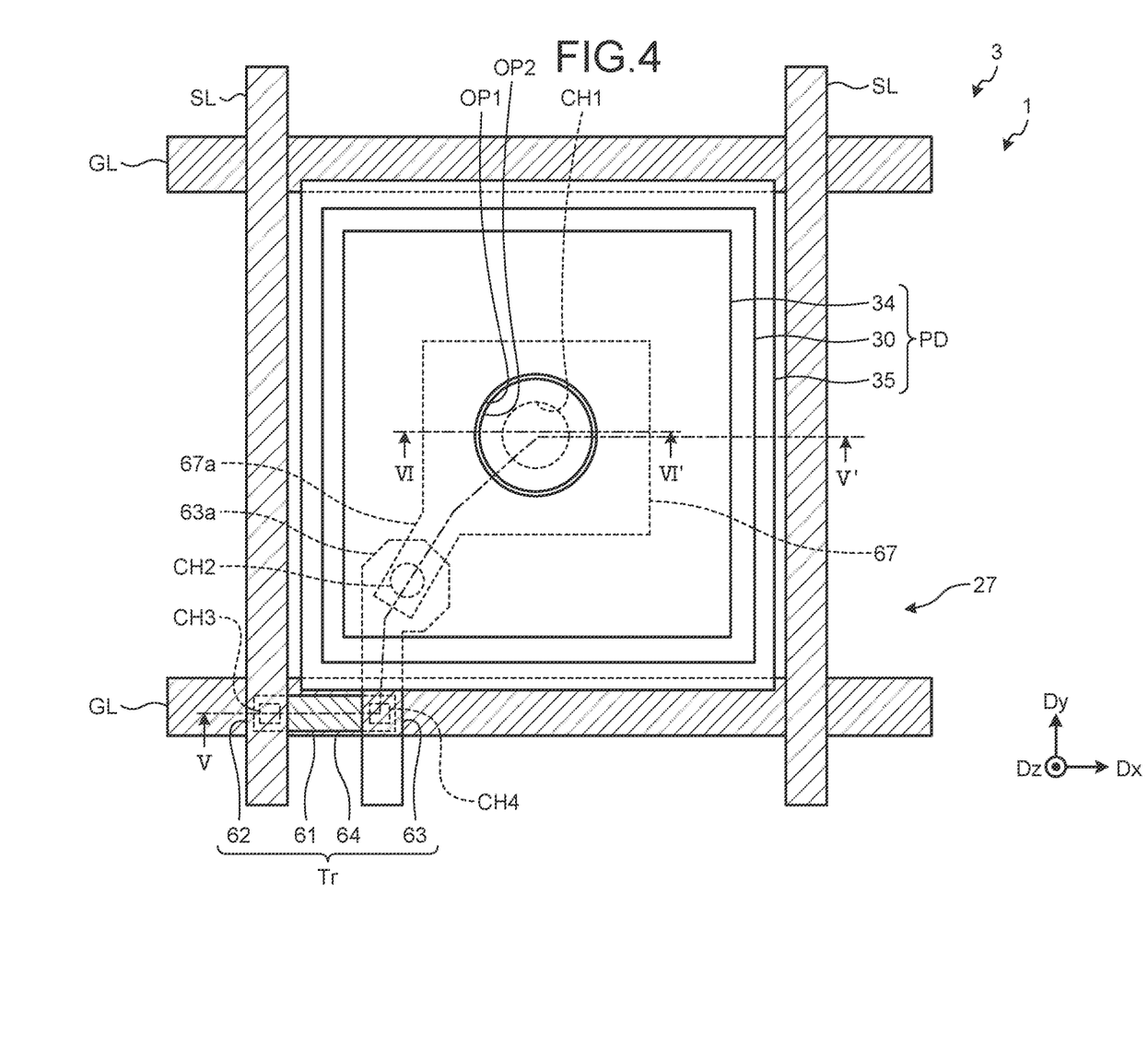
FIG. 4 is a plan view schematically illustrating a photodiode and a transistor according to the first embodiment.

The signal line selection circuit 16 is a switch circuit that sequentially or simultaneously selects a plurality of signal lines SL (refer to FIG. 4). The signal line selection circuit 16 is, for example, a multiplexer. The signal line selection circuit 16 couples the selected signal lines SL to the detection circuit 48 based on the selection signal ASW supplied from the detection control circuit 11. Through this operation, the signal line selection circuit 16 outputs the detection signal Vdet of the photodiode PD to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 is a circuit that amplifies the detection signal Vdet, and is an integration circuit, for example. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect asperities on a surface of a finger or a palm based on the signals from the detection circuit 48 when an object to be detected such as the finger is in contact with or in proximity to a detection surface. The signal processing circuit 44 may detect the information on the living body based on the signals from the detection circuit 48. Examples of the information on the living body include a vascular image, a pulse wave, pulsation, and a blood oxygen saturation level of the finger or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the object to be detected such as the finger when the contact or proximity of the object to be detected such as the finger is detected by the signal processing circuit 44. The coordinate extraction circuit 45 is the logic circuit that also obtains detected coordinates of blood vessels in the finger or the palm. The coordinate extraction circuit 45 combines the detection signals Vdet output from the detection elements 3 of the sensor 10 to generate two-dimensional information indicating the shape of the asperities on the surface of the object to be detected such as the finger. The coordinate extraction circuit 45 may output the detection signals Vdet as sensor outputs Vo instead of calculating the detected coordinates.

Figure 3:
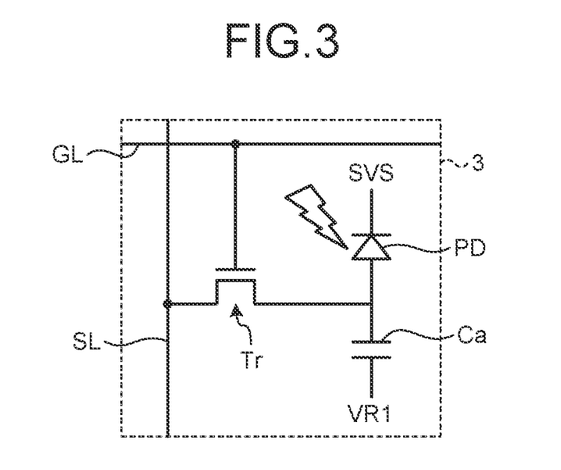
FIG. 3 is a circuit diagram illustrating one detection element.

The following describes a circuit configuration example and an operation example of the detection device 1. FIG. 3 is a circuit diagram illustrating one of the detection elements. As illustrated in FIG. 3, the detection element 3 includes the photodiode PD, the capacitive element Ca, and the transistor Tr. The transistor Tr is provided corresponding to the photodiode PD. The transistor Tr is formed of a thin-film transistor, and in this example, formed of an n-channel metal oxide semiconductor (MOS) thin-film transistor (TFT). The gate of the transistor Tr is coupled to a corresponding one of the gate lines GL. The source of the transistor Tr is coupled to a corresponding one of the signal lines SL. The drain of the transistor Tr is coupled to the anode of the photodiode PD and the capacitive element Ca.

The cathode of the photodiode PD is supplied with the power supply potential SVS from the power supply circuit 103. The capacitive element Ca is supplied with a reference signal VR1 that serves as an initial potential of the capacitive element Ca, from the power supply circuit 103.

When the detection element 3 is irradiated with light, a current corresponding to the amount of the light flows through the photodiode PD. As a result, an electric charge is stored in the capacitive element Ca. After the transistor Tr is turned on, a current corresponding to the electric charge stored in the capacitive element Ca flows through the signal line SL. The signal line SL is coupled to the detection circuit 48 through the signal line selection circuit 16. Thus, the detection device 1 can detect a signal corresponding to the amount of the light received by the photodiode PD in each of the detection elements 3.

While FIG. 3 illustrates one of the detection elements 3, the gate line GL and the signal line SL are each coupled to a plurality of the detection elements 3. Specifically, the gate line GL extends in the first direction Dx (refer to FIG. 1) and is coupled to the detection elements 3 (transistors Tr) arranged in the first direction Dx. The signal line SL extends in the second direction Dy and is coupled to the detection elements 3 (transistors Tr) arranged in the second direction Dy.

The transistor Tr is not limited to being formed of the n-type TFT and may be formed of a p-type TFT. The detection element 3 may be provided with a plurality of transistors corresponding to one photodiode PD.

The following describes a detailed configuration of the detection device 1. FIG. 4 is a plan view schematically illustrating the photodiode and the transistor according to the first embodiment. As illustrated in FIG. 4, the detection element 3 corresponds to an area surrounded by the gate lines GL and the signal lines SL.

The photodiode PD is provided in the area surrounded by the gate lines GL and the signal lines SL. The photodiode PD includes an upper electrode 34, a semiconductor layer 30, and a lower electrode 35. The upper electrode 34 and the lower electrode 35 are provided corresponding to each of the photodiodes PD. The lower electrode 35 is, for example, an anode electrode of the photodiode PD. The upper electrode 34 is, for example, a cathode electrode of the photodiode PD.

The external shape of the upper electrode 34, the semiconductor layer 30, and the lower electrode 35 of the photodiode PD is substantially quadrilateral in plan view. However, the external shape of the upper electrode 34, the semiconductor layer 30, and the lower electrode 35 is not limited thereto and may be other shapes such as a polygonal shape and a circular shape. Alternatively, the upper electrode 34, the semiconductor layer 30, and the lower electrode 35 may have, for example, a non-regular external shape partially provided with a cutout.

The transistor Tr is provided near an intersection of the gate line GL and the signal line SL. The transistor Tr includes a semiconductor layer 61, a source electrode 62, a drain electrode 63, and a gate electrode 64.

The semiconductor layer 61 is provided so as to extend in the first direction Dx and overlap the gate line GL in plan view. One end side of the semiconductor layer 61 is coupled to the source electrode 62 through a contact hole CH3. The other end side of the semiconductor layer 61 is coupled to the drain electrode 63 through a contact hole CH4.

The semiconductor layer 61 is an oxide semiconductor. The semiconductor layer 61 is more preferably a transparent amorphous oxide semiconductor (TAOS) among oxide semiconductors. Using an oxide semiconductor as the transistor Tr can reduce leakage current of the transistor Tr. That is, the transistor Tr can reduce the leak current from the detection element 3 that is not selected. As a result, the detection device 1 can improve the signal-to-noise ratio (S/N). The semiconductor layer 61 is, however, not limited to this material and may be formed of, for example, a microcrystalline oxide semiconductor, an amorphous oxide semiconductor, polysilicon, or low-temperature polysilicon (low-temperature polycrystalline silicon (LTPS)).

In the present embodiment, a portion of the gate line GL that overlaps the semiconductor layer 61 serves as the gate electrode 64. Titanium (Ti), aluminum (Al), copper (Cu), silver (Ag), molybdenum (Mo) or an alloy thereof is used as the gate electrode 64 (gate line GL). A channel region is formed in a portion of the semiconductor layer 61 that overlaps the gate electrode 64.

A portion of the signal line SL that overlaps the semiconductor layer 61 serves as the source electrode 62. The drain electrode 63 extends in the second direction Dy so as to intersect the gate line GL in plan view. A coupling portion 63a at an end of the drain electrode 63 is provided in a position overlapping the photodiode PD. The width in the first direction Dx of the coupling portion 63a is formed to be greater than the width in the first direction Dx of the drain electrode 63.

The coupling portion 63a is coupled to a lead wiring 67a drawn out from a coupling wiring 67 through a contact hole CH2. The coupling wiring 67 is located in a central portion of the photodiode PD in plan view, and the external shape thereof is formed to have a polygonal shape. The lead wiring 67a is coupled to the coupling wiring 67, and extends in an oblique direction toward the transistor Tr.

The lower electrode 35 of the photodiode PD is coupled to the coupling wiring 67 through a contact hole CH1. The upper electrode 34 and the semiconductor layer 30 are provided with a first opening OP1 and a second opening OP2, respectively, in positions overlapping the contact hole CH1. The contact hole CH1, the first opening OP1, and the second opening OP2 are located in the central portion of the photodiode PD in plan view. A coupling configuration of the photodiode PD to the coupling wiring 67, and details of the first and the second openings OP1 and OP2 will be described later with reference to FIGS. 5 and 6.

The external shape of the coupling wiring 67 is not limited to the polygonal shape and may be circular, quadrilateral, or other shapes. The lead wiring 67a may be drawn in any way as long as being able to be coupled to the coupling portion 63a of the drain electrode 63. Alternatively, the lead wiring 67a may be eliminated, and the coupling wiring 67 may be coupled to the coupling portion 63a of the drain electrode 63. In the following description, the coupling wiring 67 and the lead wiring 67a may be simply referred to as the coupling wiring 67 when they need not be distinguished from each other.

For example, the arrangement and the shape of the transistors Tr are also merely exemplary and can be changed as appropriate. For example, the semiconductor layer 61 may have a portion that does not overlap the gate line GL in plan view.

Figure 5:
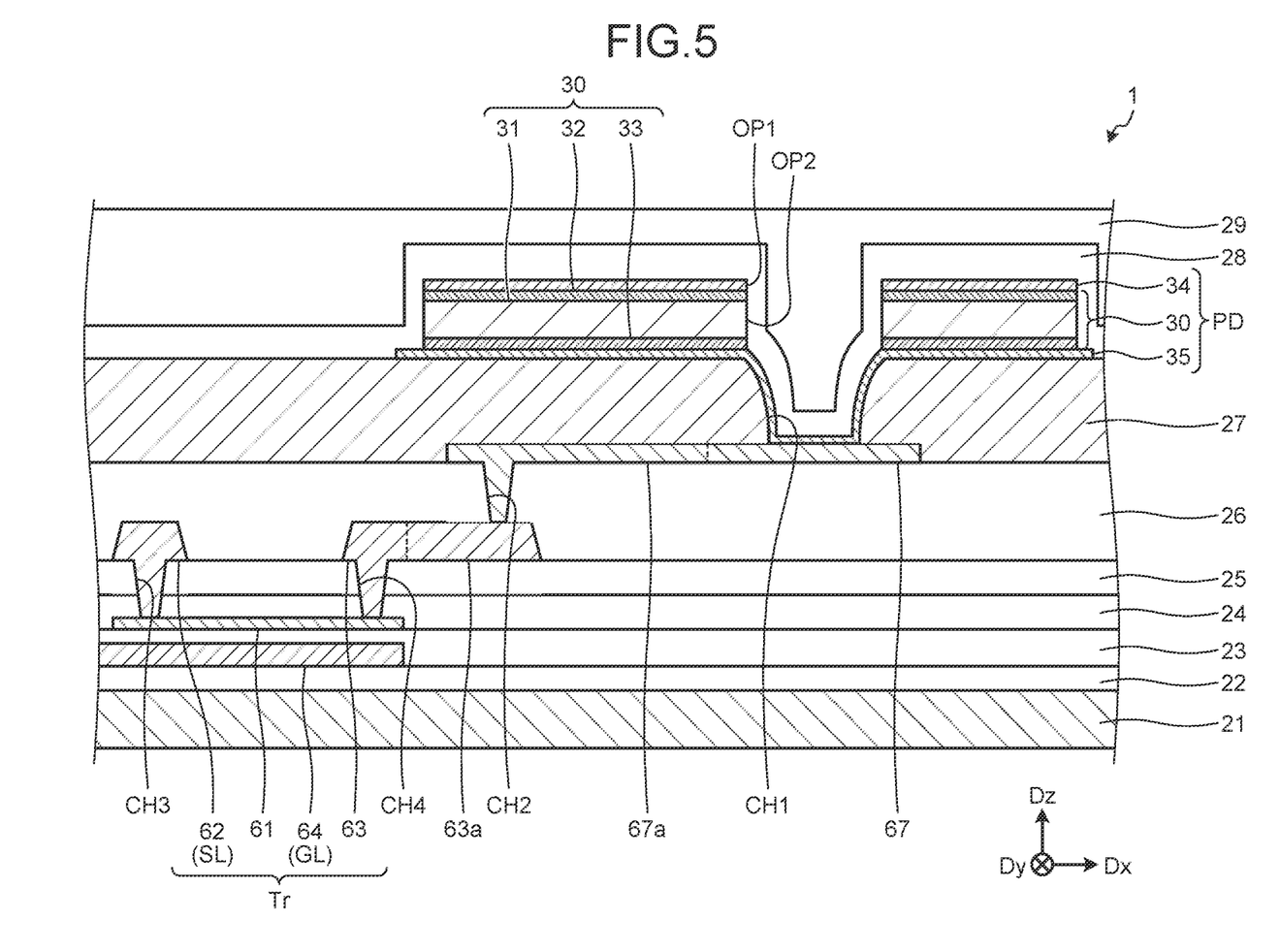
FIG. 5 is a V-V' sectional view of FIG. 4.

The following describes a multilayered configuration of the detection device 1. FIG. 5 is a V-V' sectional view of FIG. 4. In the following description, a direction from the substrate 21 toward a sealing film 29 in a direction orthogonal to a surface of the substrate 21 is referred to as "upper side" or simply "above". A direction from the sealing film 29 toward the substrate 21 is referred to as "lower side" or simply "below".

As illustrated in FIG. 5, The substrate 21 is an insulating substrate and is made using, for example, glass or a resin material. The substrate 21 is not limited to having a flat plate shape and may have a curved surface. In this case, the substrate 21 may be a film-like resin substrate.

Insulating layers 22, 23, 24, and 25 are provided on the substrate 21. The insulating layers 22, 23, 24, and 25 are inorganic insulating films made of, for example, silicon oxide ($SiO_2$) or silicon nitride (SiN). Each of the inorganic insulating layers is not limited to a single layer and may be a multilayered film.

The gate electrode 64 (gate line GL) is provided on the insulating layer 22. The insulating layer 23 is provided on the insulating layer 22 so as to cover the gate electrode 64 (gate line GL). The semiconductor layer 61 is provided on the insulating layer 23. The insulating layers 24 and 25 are provided on the insulating layer 23 so as to cover the semiconductor layer 61. The insulating layer 22 need not be formed.

The source electrode 62 (signal line SL) and the drain electrode 63 (coupling portion 63a) are provided on the insulating layer 25. The source electrode 62 is electrically coupled to the semiconductor layer 61 through the contact hole CH3 provided in the insulating layers 24 and 25. The drain electrode 63 is electrically coupled to the semiconductor layer 61 through the contact hole CH4 provided in the insulating layers 24 and 25. The drain electrode 63 and the coupling portion 63a are provided so as to extend from an area that does not overlap the photodiode PD to an area that overlaps the photodiode PD.

An insulating layer 26 is provided on the insulating layer 25 so as to cover the source electrode 62 (signal line SL) and the drain electrode 63 (coupling portion 63a). The coupling wiring 67 and the lead wiring 67a are provided on the insulating layer 26. The lead wiring 67a is coupled to the drain electrode 63 (coupling portion 63a) through the contact hole CH2 provided in the insulating layer 26. The coupling wiring 67 and the lead wiring 67a are provided in an area that overlaps the photodiode PD. In other words, the coupling wiring 67 and the lead wiring 67a are positioned between the substrate 21 and the photodiode PD in the third direction Dz.

An insulating layer 27 is provided on the insulating layer 26 so as to cover the coupling wiring 67 and the lead wiring 67a. The insulating layers 26 and 27 are organic insulating films formed of, for example, an acrylic resin. The insulating layers 26 and 27 are planarizing layers that are provided so as to cover the transistor Tr and planarize asperities formed by the transistor Tr and various types of wiring. The insulating layers 26 and 27 are insulating films provided between the layers of the transistor Tr and the photodiode PD.

The following describes a multilayered configuration of the photodiode PD. The photodiode PD is stacked in the order of the lower electrode 35, the semiconductor layer 30, and the upper electrode 34 above the substrate 21, more specifically, on top of the insulating layer 27.

The lower electrode 35 is provided on the insulating layer 27, and is electrically coupled to the coupling wiring 67 through the contact hole CH1 provided in the insulating layer 27. The contact hole CH1 provided in the insulating layer 27 is provided in the central portion of the photodiode PD in plan view (refer to FIG. 4). The lower electrode 35 is the anode of the photodiode PD and is an electrode for reading the detection signal Vdet. For example, a metal material such as molybdenum (Mo) or aluminum (Al) is used as the lower electrode 35. Alternatively, the lower electrode 35 may be a multilayered film formed by stacking a plurality of layers of these metal materials. The lower electrode 35 may be a light-transmitting conductive material, such as indium tin oxide (ITO) or indium zinc oxide (IZO).

The semiconductor layer 30 includes an i-type semiconductor layer 31, a p-type semiconductor layer 32, and an n-type semiconductor layer 33. The i-type semiconductor layer 31, the p-type semiconductor layer 32, and the n-type semiconductor layer 33 are formed of amorphous silicon (a-Si), for example. In FIG. 5, the n-type semiconductor layer 33, the i-type semiconductor layer 31, and the p-type semiconductor layer 32 are stacked in this order in the direction orthogonal to the surface of the substrate 21. However, the semiconductor layer 30 may have a reversed configuration, that is, the p-type semiconductor layer 32, the i-type semiconductor layer 31, and the n-type semiconductor layer 33 may be stacked in this order.

The a-Si of the p-type semiconductor layer 32 is doped with impurities to form a p+ region. The a-Si of the n-type semiconductor layer 33 is doped with impurities to form an n+ region. The i-type semiconductor layer 31 is, for example, a non-doped intrinsic semiconductor, and has lower conductivity than that of the p-type semiconductor layer 32 and the n-type semiconductor layer 33.

The upper electrode 34 is the cathode of the photodiode PD and is an electrode for supplying the power supply potential SVS to the semiconductor layer 30. The upper electrode 34 is a light-transmitting conductive layer of ITO, for example. A plurality of the upper electrodes 34 are provided for the respective photodiodes PD.

The second opening OP2 is provided in an area of the semiconductor layer 30 that overlaps the contact hole CH1. The first opening OP1 is provided in an area of the upper electrode 34 that overlaps the contact hole CH1. An insulating layer 28 and the sealing film 29 are provided on the insulating layer 27 so as to cover the photodiode PD. The insulating layer 28 and the sealing film 29 are provided so as to cover the lower electrode 35 in an area overlapping the first opening OP1 and the second opening OP2. An inorganic insulating film, such as a silicon nitride film or an aluminum oxide film, or a resin film, such as an acrylic film, is used as each of the insulating layer 28 and the sealing film 29. The sealing film 29 is not limited to a single layer and may be a multilayered film having two or more layers obtained by combining the inorganic film with the resin film mentioned above. The sealing film 29 well seals the photodiode PD, and thus can restrain water from entering the photodiode PD from the upper surface side thereof.

Figure 6:
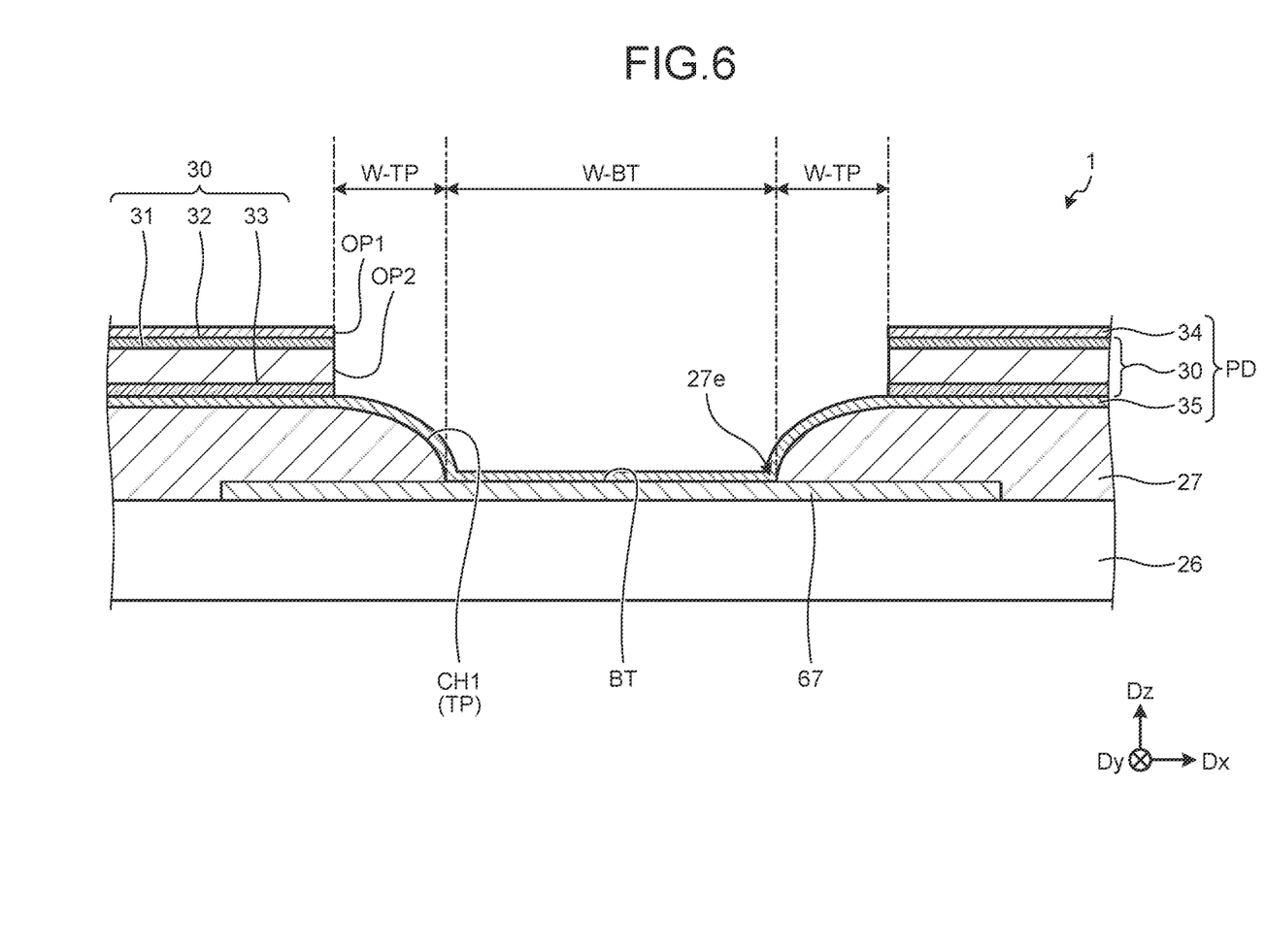
FIG. 6 is a VI-VI' sectional view of FIG. 4.

The following describes a configuration of the photodiode PD at and near the contact hole CH1, the first opening OP1, and the second opening OP2. FIG. 6 is a VI-VI' sectional view of FIG. 4. In FIG. 4, in order to illustrate line VI-VI', line VI-VI' is offset from line V-V', but FIGS. 5 and 6 both illustrate the section passing through the center of the contact hole CH1 (centroid of a bottom BT) in plan view. As illustrated in FIG. 6, the lower electrode 35 of the photodiode PD is provided on the insulating layer 27 and is provided continuously in the area overlapping the contact hole CH1. In more detail, the lower electrode 35 is provided continuously across the bottom BT and an inclined surface TP of the contact hole CH1. The lower electrode 35 is coupled to the coupling wiring 67 at the bottom BT of the contact hole CH1. This configuration electrically couples the photodiode PD to the transistor Tr through the contact hole CH1 and the coupling wiring 67.

A width W-BT in the first direction Dx of the bottom BT of the contact hole CH1 is greater than a width W-TP in the first direction Dx of the inclined surface TP. In the sectional view, the bottom BT of contact hole CH1 is located between the two inclined surfaces TP. The width W-BT in the first direction Dx of the bottom BT is greater than the width W-TP in the first direction Dx of at least one of the inclined surfaces TP. The width W-BT of the bottom BT is approximately 10 μm, for example, and the width W-TP of the inclined surface TP is approximately from 4 μm to 5 μm, for example. The lengths of, for example, the width W-BT and the width W-TP are lengths in the same section cut by an imaginary line that passes through the centroid of the bottom BT of contact hole CH1 in plan view and is parallel to the first direction Dx.

As described above, the first opening OP1 is provided in the area overlapping the contact hole CH1 in the upper electrode 34. The second opening OP2 is provided in the area overlapping the contact hole CH1 in the semiconductor layer 30. The first opening OP1 of the upper electrode 34 and the second opening OP2 of the semiconductor layer 30 are provided in the central portion of the photodiode PD in plan view (refer to FIG. 4). The second opening OP2 of the semiconductor layer 30 is provided so as to overlap the first opening OP1 of the upper electrode 34 in plan view. In other words, the semiconductor layer 30 and the upper electrode 34 are not provided in an area overlapping the bottom BT and the inclined surface TP of the contact hole CH1 on the upper side of the lower electrode 35.

The width in the first direction Dx of the first opening OP1 of the upper electrode 34 is equal to or greater than the total length of the width W-BT of the bottom BT and the widths W-TP of the inclined surfaces TP of the contact hole CH1. In the same manner, the width of the second opening OP2 of the semiconductor layer 30 is equal to or greater than the total length of the width W-BT of the bottom BT and the widths W-TP of the inclined surfaces TP of the contact hole CH1.

Such a configuration prevents the semiconductor layer 30 and the upper electrode 34 from being provided at least at a step of the contact hole CH1, and therefore, reduces generation of a leak path LP (refer to FIG. 9), such as a seam of the semiconductor layer 30 that would be caused by the step of the contact hole CH1. As a result, in the detection device 1, the occurrence of a short circuit between the upper electrode 34 and the lower electrode 35 can be reduced. The step of the contact hole CH1 is more specifically a portion where a lower end 27e of an inner wall of the insulating layer 27 forming the contact hole CH1 bends and contacts the coupling wiring 67.

Since the semiconductor layer 30 and the upper electrode 34 are not provided at least at the step of the contact hole CH1, the inclined surface TP of the contact hole CH1 need not be formed with a gentle inclination in order to reduce the generation of the leak path LP of the semiconductor layer 30. As a result, the degree of freedom of the shape of the contact hole CH1 can be increased, and the width W-TP of the inclined surface TP can be formed to be reduced. That is, the inclination angle of the inclined surface TP can be increased. Thus, the area of contact hole CH1 including the inclined surface TP and the bottom BT can be reduced relative to the area of the entire photodiode PD. As a result, the areas of the first opening OP1 of the upper electrode 34 and the second opening OP2 of the semiconductor layer 30 can also be reduced. Consequently, the detection device 1 can achieve a higher definition by restraining the reduction in effective light-receiving area of the photodiode PD.

Since the contact hole CH1, the first opening OP1, and the second opening OP2 are located in the central portion of the photodiode PD in plan view, the non-uniformity of the shapes and the variation of the positions of the contact hole CH1, the first opening OP1, and the second opening OP2 can be reduced compared with a case where they are located at ends or corners of the photodiode PD.

Thus, in the detection device 1 of the present embodiment, the width W-BT of the bottom BT and the width W-TP of the inclined surface TP need not be formed larger taking into account the variation in the shape of the contact hole CH1. The widths (diameters) of the first opening OP1 of the upper electrode 34 and the second opening OP2 of the semiconductor layer 30 also need not be formed larger taking into account the variation in the shape of the contact hole CH1. As a result, restrictions can be made relax on, for example, the placement of the photodiode PD and the shape and area of the first and the second openings OP1 and OP2 due to the positional relation with the transistor Tr and the coupling wiring 67. Therefore, in the detection device 1, the reduction in the effective light-receiving area of the photodiode PD can be restrained.

The semiconductor layer 30 and the upper electrode 34 are provided at least so as not to overlap the step of the contact hole CH1 (coupling place between the lower end 27e of the inner wall of the insulating layer 27 and the coupling wiring 67). That is, the semiconductor layer 30 and the upper electrode 34 may be provided in a flat area of the insulating layer 27 and may also overlap a portion of the inclined surface TP of the contact hole CH1. The width in the first direction Dx of the first opening OP1 of the upper electrode 34 is greater than at least the width W-BT of the bottom BT of the contact hole CH1. In the same manner, the width of the second opening OP2 of the semiconductor layer 30 is greater than at least the width W-BT of the bottom BT of the contact hole CH1. The width in the first direction Dx of the first opening OP1 of the upper electrode 34 is substantially equal to the width of the second opening OP2 of the semiconductor layer 30. However, the width in the first direction Dx of the first opening OP1 of the upper electrode 34 is not limited to being as described above and may be greater than the width of the second opening OP2 of the semiconductor layer 30.

First Modification of First Embodiment

Figure 7:
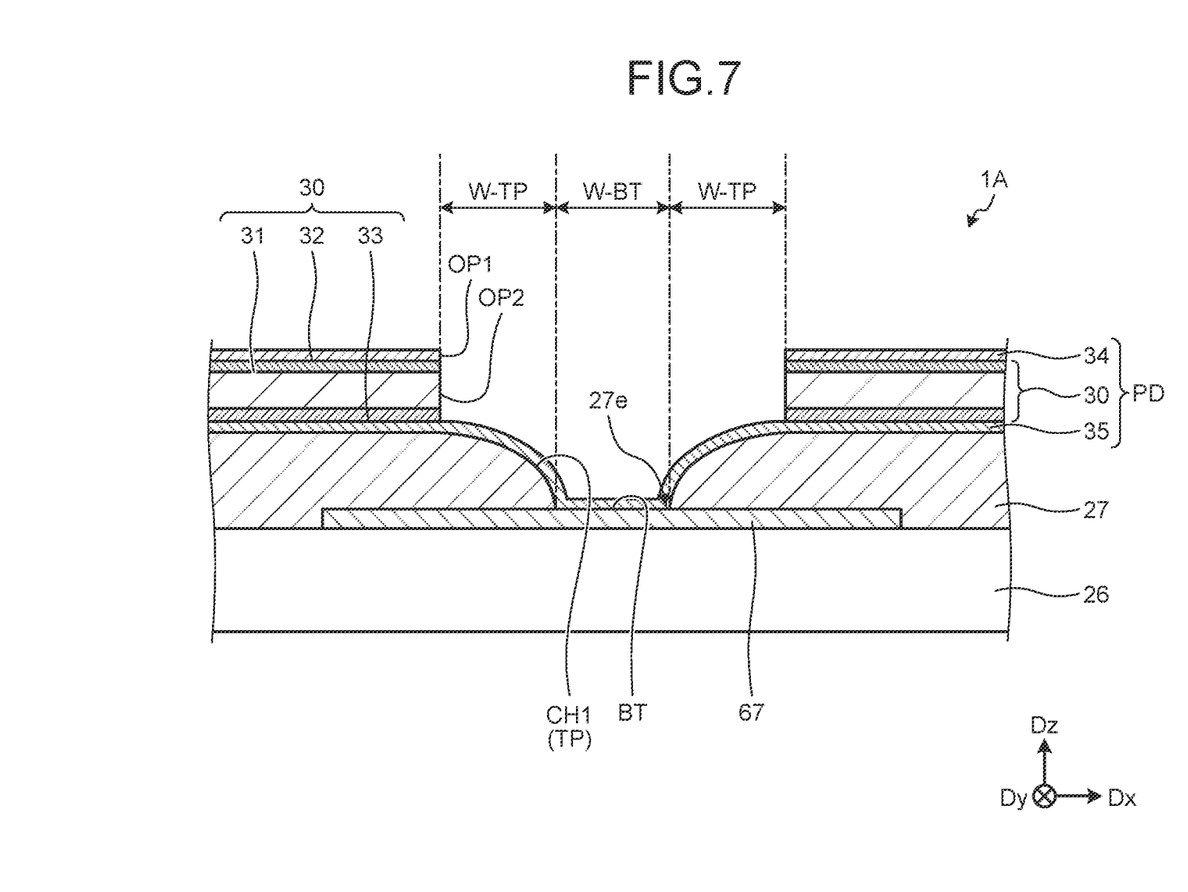
FIG. 7 is a sectional view schematically illustrating a detection device according to a first modification of the first embodiment.

FIG. 7 is a sectional view schematically illustrating a detection device according to a first modification of the first embodiment. In the following description, the same components as those described in the embodiment described above are denoted by the same reference numerals, and the description thereof will not be repeated.

As illustrated in FIG. 7, in a detection device 1A according to the first modification, the width W-BT in the first direction Dx of the bottom BT of the contact hole CH1 is equal to or less than the width W-TP in the first direction Dx of the inclined surface TP of the contact hole CH1. In the first modification, the width W-BT of the bottom BT is approximately 4 µm, for example, and the width W-TP of the inclined surface TP is approximately from 4 µm to 5 µm, for example.

As described above, in the detection device 1A according to the first modification, the step of the contact hole CH1 need not be formed with a gentle inclination, and the area of the contact hole CH1 only needs to be large enough to ensure at least the coupling between the lower electrode 35 and the coupling wiring 67 at the bottom BT. In the detection device 1A according to the first modification, the area of contact hole CH1 is formed smaller than that in the first embodiment described above. Therefore, the effective light-receiving area of the photodiode PD can be increased. The width W-BT of the bottom BT and the width W-TP of the inclined surface TP are merely exemplary and can be changed as appropriate.

Second Modification of First Embodiment

Figure 8:
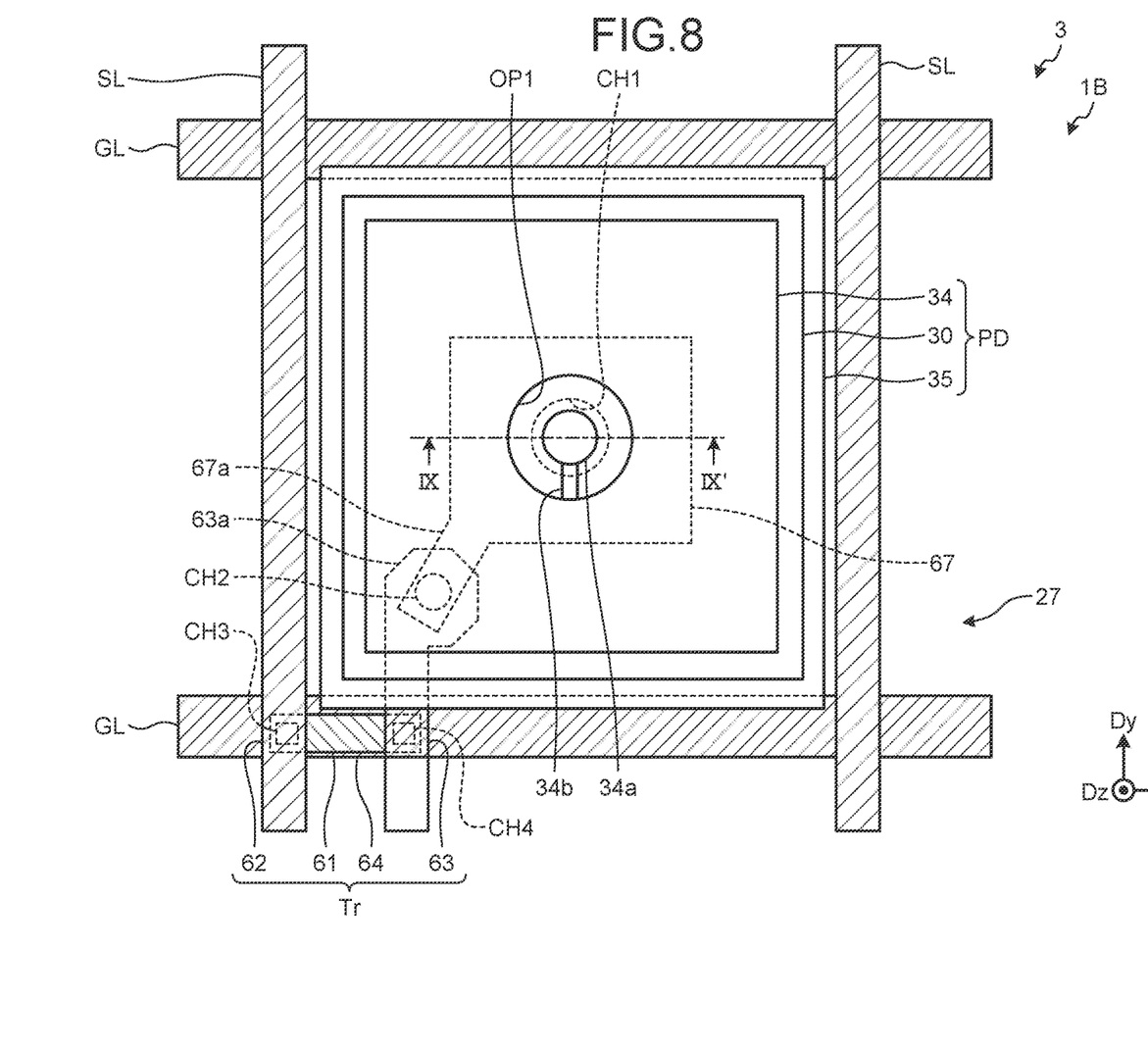
FIG. 8 is a plan view schematically illustrating a photodiode and a transistor of a detection device according to a second modification of the first embodiment.
Figure 9:
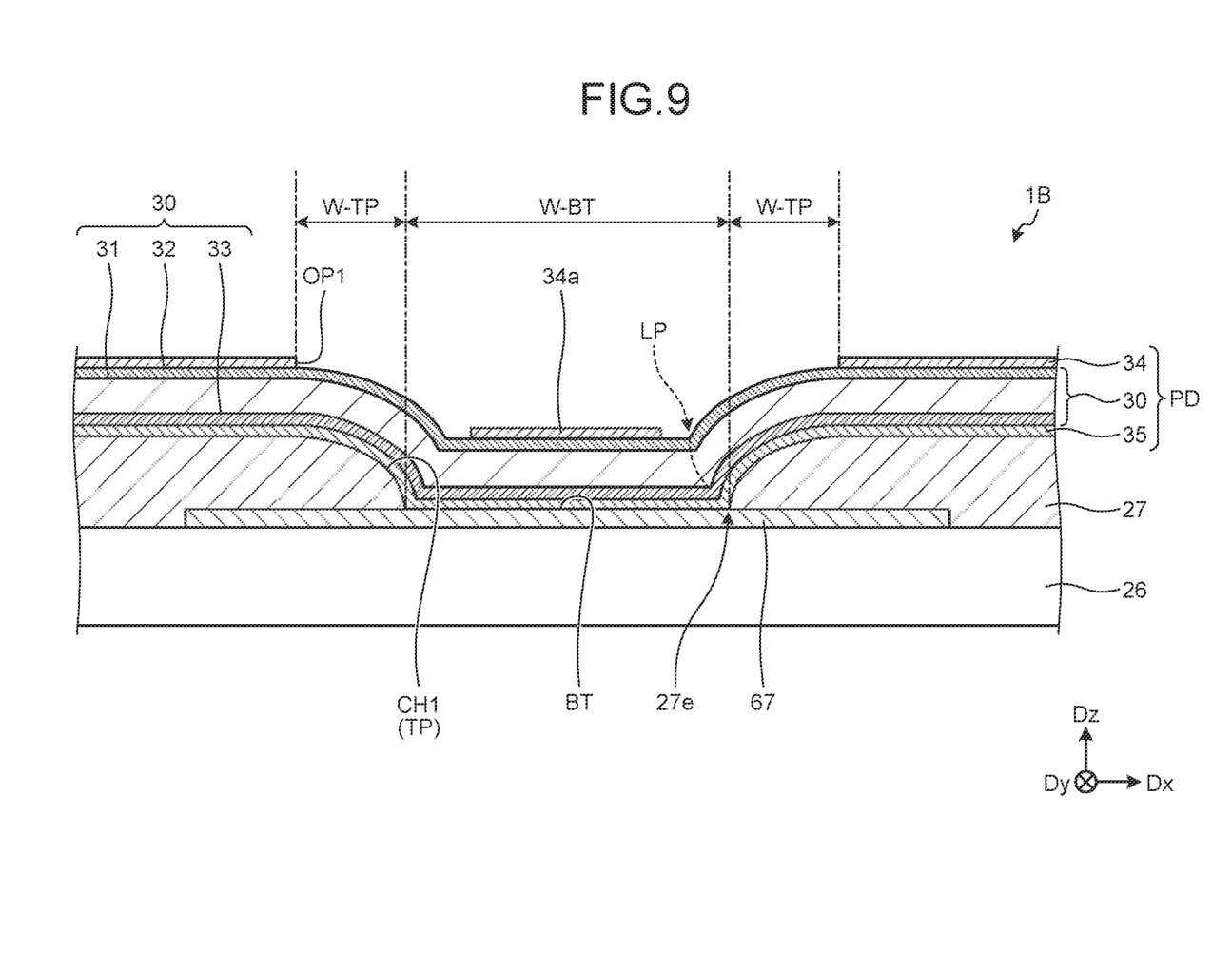
FIG. 9 is a IX-IX' sectional view of FIG. 8.

FIG. 8 is a plan view schematically illustrating the photodiode and the transistor of a detection device according to a second modification of the first embodiment. FIG. 9 is a IX-IX' sectional view of FIG. 8.

As illustrated in FIGS. 8 and 9, the configuration of a detection device 1B according to the second modification differs from those in the first embodiment and the first modification described above in that the second opening OP2 is not provided in the semiconductor layer 30 of the photodiode PD.

As illustrated in FIG. 9, the lower electrode 35 and the semiconductor layer 30 of the photodiode PD are provided on the insulating layer 27 and is provided continuously in the area overlapping the contact hole CH1. In more detail, the lower electrode 35 and the semiconductor layer 30 are provided continuously across the bottom BT and the inclined surface TP of the contact hole CH1. The first opening OP1 of the upper electrode 34 is provided in the area overlapping the contact hole CH1 on the upper side of the semiconductor layer 30.

In more detail, the lower electrode 35 and the semiconductor layer 30 are provided so as to cover the portion where the lower end 27e of the inner wall of the insulating layer 27 forming the contact hole CH1 bends and contacts the coupling wiring 67. The upper electrode 34 is provided in the flat area of the insulating layer 27, and is provided at least in an area that does not overlap the step of the contact hole CH1 (coupling place between the lower end 27e of the inner wall of the insulating layer 27 and the coupling wiring 67). In more detail, the semiconductor layer 30 has a step formed corresponding to the step of the contact hole CH1. The upper electrode 34 is provided at least in an area that does not overlap the step of the semiconductor layer 30. In other words, the periphery of the first opening OP1 of the upper electrode 34 may overlap a portion of the inclined surface TP of the contact hole CH1.

Figure 10:
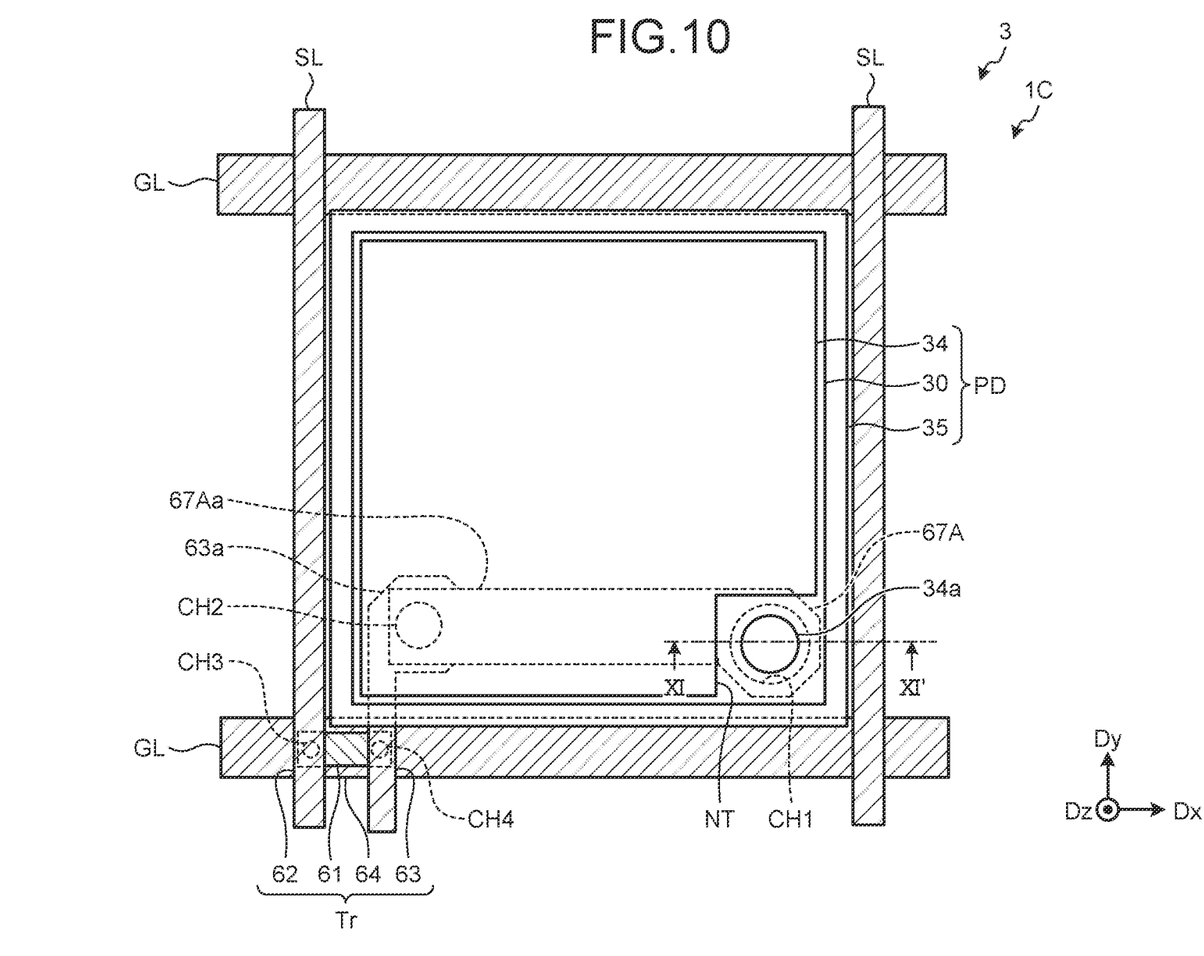
FIG. 10 is a plan view schematically illustrating a photodiode and a transistor of a detection device according to a second embodiment.

In addition, the upper electrode 34 includes an island electrode 34a and a coupling portion 34b (refer to FIG. 10). The island electrode 34a is provided in an area that overlaps the first opening OP1 and also overlaps the bottom BT of the contact hole CH1 on the upper side of the semiconductor layer 30. The island electrode 34a is provided at least in an area that does not overlap the step of the semiconductor layer 30. The width in the first direction Dx of the island electrode 34a is less than the width W-BT in the first direction Dx of the bottom BT of the contact hole CH1. The coupling portion 34b is narrower than the island electrode 34a and couples the island electrode 34a to the upper electrode 34.

In the second modification, the first opening OP1 is provided in the upper electrode 34, and the upper electrode 34 is provided at least in an area that does not overlap the step of the semiconductor layer 30. This configuration can reduce the occurrence of the short circuit between the upper electrode 34 and the lower electrode 35 even if the leak path LP, such as the seam of the semiconductor layer 30, is generated due to the step of the contact hole CH1.

The semiconductor layer 30 is provided continuously over the area overlapping the contact hole CH1. In addition, since the upper electrode 34 includes the island electrode 34a, the effective light-receiving area of the photodiode PD can be larger than that in the first embodiment described above. Although the coupling portion 34b is provided across the step of the semiconductor layer 30, the width of the coupling portion 34b is much less than the total length along the outer periphery of the step of the semiconductor layer 30. Therefore, the leakage at the coupling portion 34b is negligibly small. In the detection device 1B of the second modification, the island electrode 34a and the coupling portion 34b may be omitted.

Second Embodiment

Figure 11:
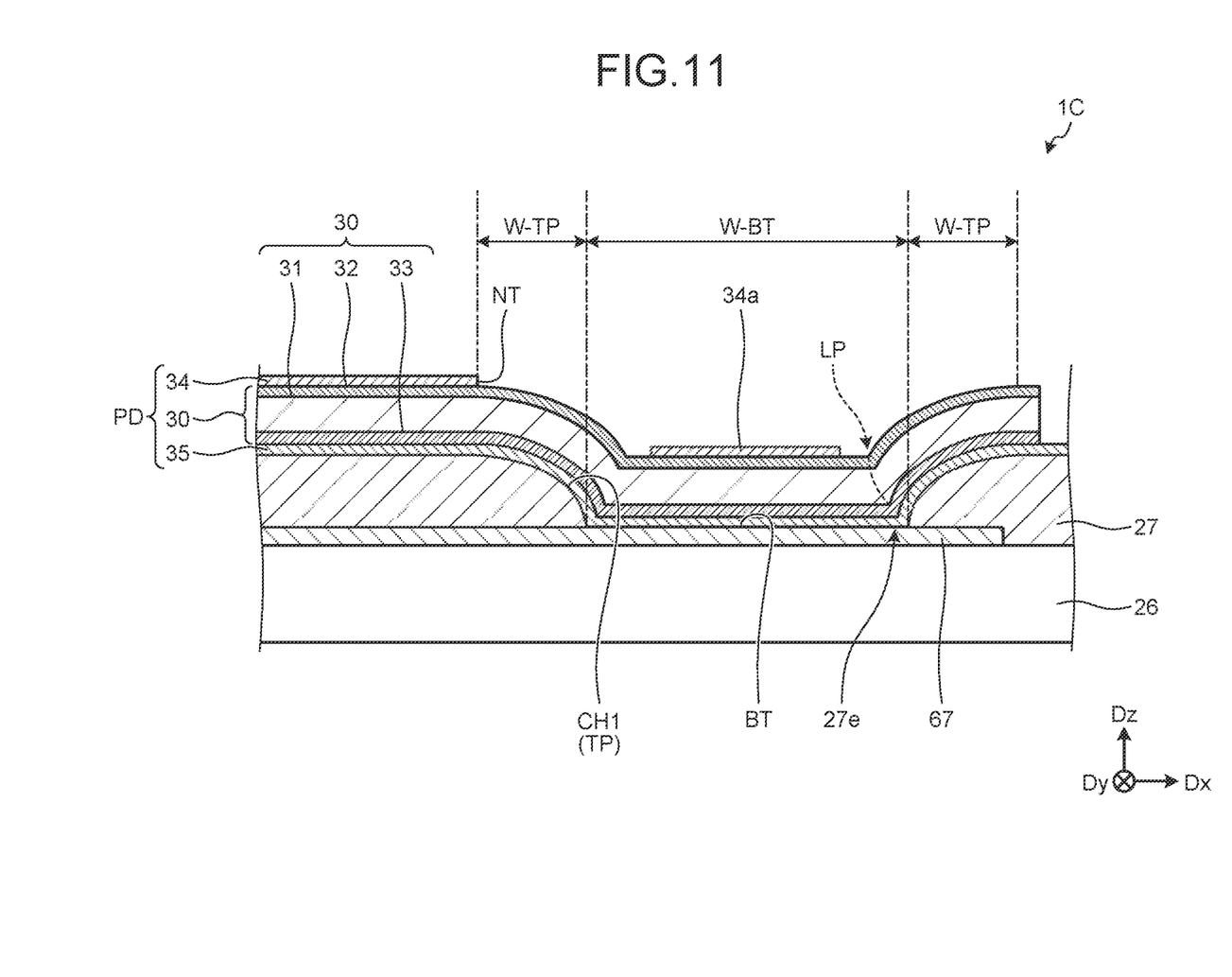
FIG. 11 is an XI-XI' sectional view of FIG. 10.

FIG. 10 is a plan view schematically illustrating the photodiode and the transistor of a detection device according to a second embodiment. FIG. 11 is an XI-XI' sectional view of FIG. 10. As illustrated in FIG. 10, in a detection device 1C according to the second embodiment, the contact hole CH1 provided in the insulating layer 27 is provided at a corner of the photodiode PD in plan view.

Coupling wiring 67A is disposed in a position located at the corner of the photodiode PD and overlapping the contact hole CH1 in plan view. Lead wiring 67Aa is coupled to the coupling wiring 67A and extends in the first direction Dx along the gate line GL toward the transistor Tr. The lead wiring 67Aa is electrically coupled to the drain electrode 63 of transistor Tr through the contact hole CH2 and the coupling portion 63a. The lead wiring 67Aa may extend in the second direction Dy along the signal line SL.

As illustrated in FIGS. 10 and 11, the lower electrode 35 and the semiconductor layer 30 of the photodiode PD are provided on the insulating layer 27 and is provided continuously in the area overlapping the contact hole CH1. In more detail, the lower electrode 35 and the semiconductor layer 30 are provided continuously across the bottom BT and the inclined surface TP of the contact hole CH1. The lower electrode 35 is coupled to the coupling wiring 67A at the bottom BT of the contact hole CH1 at the corner of the photodiode PD. This configuration electrically couples the photodiode PD to the transistor Tr through the contact hole CH1 and the coupling wiring 67A.

A cutout NT is provided in the area overlapping the contact hole CH1 in the upper electrode 34 on the upper side of the semiconductor layer 30. The cutout NT of the upper electrode 34 is provided corresponding to the contact hole CH1 at the corner of the photodiode PD. The upper electrode 34 is provided in the flat area of the insulating layer 27 and is provided at least in an area that does not overlap the step of the contact hole CH1 (coupling place between the lower end 27e of the inner wall of the insulating layer 27 and the coupling wiring 67A). The upper electrode 34 is provided at least in an area that does not overlap the step of the semiconductor layer 30. That is, ends of the cutout NT of the upper electrode 34 may overlap a portion of the inclined surface TP of the contact hole CH1.

In the same manner as in the second modification described above, the upper electrode 34 includes the island electrode 34a. The island electrode 34a is provided in an area where the cutout NT is formed and that overlaps the bottom BT of the contact hole CH1 on the upper side of the semiconductor layer 30. The island electrode 34a is provided at least in an area that does not overlap the step of the semiconductor layer 30. That is, the width in the first direction Dx of the island electrode 34a is less than the width W-BT in the first direction Dx of the bottom BT of the contact hole CH1. The coupling portion 34b is narrower than the island electrode 34a and couples the island electrode 34a to the upper electrode 34.

In the second embodiment, the island electrode 34a is electrically coupled to the power supply circuit 103 at any place and is supplied with a signal having the same potential as the power supply potential SVS supplied to the upper electrode 34. The island electrode 34a may be coupled to the upper electrode 34 through the coupling portion 34b in the same manner as in the second modification, or may be electrically coupled to the power supply circuit 103 through other power supply wiring.

In also the second embodiment, the upper electrode 34 is provided in the area not overlapping the step of the semiconductor layer 30. Therefore, the occurrence of the short circuit between the upper electrode 34 and the lower electrode 35 can be reduced even if the leak path LP, such as the seam of the semiconductor layer 30, is generated due to the step of the contact hole CH1. Since the lower electrode 35 and the semiconductor layer 30 are provided across the area overlapping the contact hole CH1, the effective light-receiving area of the photodiode PD can be larger than that in the configuration in which the cutout NT is formed in the semiconductor layer 30 and the upper electrode 34. As a result, in the detection device 1C, it is possible to restrain a reduction in detection sensitivity and the occurrence of the short circuit between the upper electrode 34 and the lower electrode 35.

The shape of the cutout NT in plan view illustrated in FIG. 10 is merely exemplary and can be changed as appropriate. For example, the cutout NT may be a part of a polygonal shape or a part of an arc.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiments and the modifications described above.

What is claimed is:

1. A detection device comprising:
   a substrate;
   a photodiode in which a lower electrode, a semiconductor layer, and an upper electrode are stacked on the substrate in the order as listed;
   a transistor provided in the photodiode; and
   an insulating layer provided between layers of the transistor and the photodiode, wherein
   the insulating layer has a contact hole provided in a central portion of the photodiode in plan view,
   the lower electrode of the photodiode is provided on the insulating layer, is provided continuously in an area overlapping the contact hole, and is electrically coupled to the transistor at a bottom of the contact hole, and
   a first opening is provided in an area of the upper electrode that overlaps the contact hole.

2. The detection device according to claim 1, wherein
   the semiconductor layer has a second opening provided in an area overlapping the contact hole, and
   the second opening of the semiconductor layer and the first opening of the upper electrode are provided so as to overlap each other in plan view.

3. The detection device according to claim 2, wherein a width of the second opening of the semiconductor layer is greater than a width of the bottom of the contact hole.

4. The detection device according to claim 1, wherein a width of the first opening of the upper electrode is greater than a width of the bottom of the contact hole.

5. The detection device according to claim 1, wherein
   the lower electrode and the semiconductor layer of the photodiode are provided on the upper side of the insulating layer and are provided continuously in an area overlapping the contact hole, and
   the first opening of the upper electrode is provided on the upper side of the semiconductor layer.

6. The detection device according to claim 5, wherein the upper electrode comprises an island electrode provided on the upper side of the semiconductor layer in an area that overlaps the first opening and also overlaps the bottom of the contact hole.

7. The detection device according to claim 1, wherein a width of the bottom of the contact hole in a first direction parallel to the substrate is equal to or less than a width of an inclined surface of the contact hole in the first direction.

8. A detection device comprising:
   a substrate;
   a photodiode in which a lower electrode, a semiconductor layer, and an upper electrode are stacked on the substrate in the order as listed;
   a transistor provided in the photodiode; and
   an insulating layer provided between layers of the transistor and the photodiode, wherein
   the insulating layer has a contact hole provided at a corner of the photodiode in plan view,
   the lower electrode and the semiconductor layer of the photodiode are provided on the insulating layer and are provided continuously in an area overlapping the contact hole,
   the lower electrode is electrically coupled to the transistor at a bottom of the contact hole, and a cutout is provided in an area of the upper electrode that overlaps the contact hole on the upper side of the semiconductor layer.

9. The detection device according to claim 8, wherein the upper electrode comprises an island electrode provided on the upper side of the semiconductor layer in an area that overlaps the cutout and also overlaps the bottom of the contact hole.

\* \* \* \* \*